United States Patent
Mende et al.

(10) Patent No.: US 9,331,776 B2
(45) Date of Patent: May 3, 2016

(54) EXTENDED RANGE ELECTRO-OPTIC VOLTAGE ACCESSORY

(71) Applicant: Tektronix, Inc., Beaverton, OR (US)

(72) Inventors: Michael J. Mende, Portland, OR (US); Richard A. Booman, Lake Oswego, OR (US)

(73) Assignee: TEKTRONIX, INC., Beaverton, OR (US)

(*) Notice: Subject to any disclaimer, the term of this patent is extended or adjusted under 35 U.S.C. 154(b) by 331 days.

(21) Appl. No.: 14/133,404

(22) Filed: Dec. 18, 2013

(65) Prior Publication Data

US 2015/0171960 A1 Jun. 18, 2015

(51) Int. Cl.
*G01B 11/02* (2006.01)
*H04B 10/079* (2013.01)
*G01R 13/02* (2006.01)
*G01R 1/07* (2006.01)

(52) U.S. Cl.
CPC .............. *H04B 10/079* (2013.01); *G01R 1/071* (2013.01); *G01R 13/0281* (2013.01)

(58) Field of Classification Search
CPC .... H04B 10/079; G01R 35/005; G01R 1/071; G01J 2009/0288
See application file for complete search history.

(56) References Cited

U.S. PATENT DOCUMENTS

| 5,165,100 | A | 11/1992 | Hsieh et al. |
| 5,955,875 | A | 9/1999 | Twichell et al. |
| 9,209,593 | B2 * | 12/2015 | Mende ................ H01S 3/10015 |
| 2009/0072811 | A1 | 3/2009 | Marciante et al. |

OTHER PUBLICATIONS

Extended European Search Report for European Patent Application No. 14198908.7, 6 pages, Munich, dated May 26, 2015.

* cited by examiner

*Primary Examiner* — Hwa Lee
(74) *Attorney, Agent, or Firm* — Marger Johnson

(57) ABSTRACT

A test and measurement system including an electro-optical voltage accessory with an electro-optical sensor configured to output a modulated output signal, a device under test connected to the electro-optical voltage accessory with a variable input signal that exceeds a linear input range of the optical sensor, and a processor. The processor is configured to modify the modulated output signal from the electro-optical voltage accessory to reconstruct the variable input signal of the electro-optical voltage accessory that exceeds the linear input range of the optical sensor.

14 Claims, 17 Drawing Sheets

EXTENDED RANGE ELECTRO-OPTIC VOLTAGE ACCESSORY

TECHNICAL FIELD

This disclosure relates generally to test and measurement systems and signal acquisition accessories and more particularly to accurately displaying an input waveform of a device under test using a voltage accessory with an optical sensor.

BACKGROUND

Electro-optical sensors, such as Mach-Zehnder interferometers, have been proposed as voltage sensors in the past. The linear voltage dynamic range of these devices, however, is limited to a fraction of a pi-voltage of the electro-optical sensor. If a device under test (DUT) is operated in this linear voltage dynamic range, then the available voltage dynamic range is determined by a signal-to-noise ratio at a receiver of the electro-optical sensor.

SUMMARY

Certain embodiments of the disclosed technology relate to a test and measurement system including an electro-optical voltage accessory with an optical sensor configured to output a modulated output signal, a device under test connected to the electro-optical voltage accessory with a variable input signal that exceeds the linear input range of the optical sensor, and a processor. The processor is configured to modify the modulated output signal from the electro-optical voltage accessory to reconstruct the variable input signal of the electro-optical voltage accessory that exceeds the pi-voltage of the electro-optical sensor.

Certain embodiments of the disclosed technology relate to a method for measuring a variable input signal of a device under test via an electro-optical voltage accessory connected to a test and measurement instrument that exceeds the linear input range of an optical sensor in the electro-optical voltage accessory. The method includes receiving at the electro-optical voltage accessory the variable input signal of the device under test, outputting from the electro-optical voltage accessory a modulated output signal based on the variable input signal, receiving the modulated output signal from the electro-optical voltage accessory at a processor, and modifying the modulated output signal from the electro-optical voltage accessory to reconstruct the variable input signal of the electro-optical voltage accessory that exceeds linear input range of the optical sensor.

DETAILED DESCRIPTION

Figure 1:
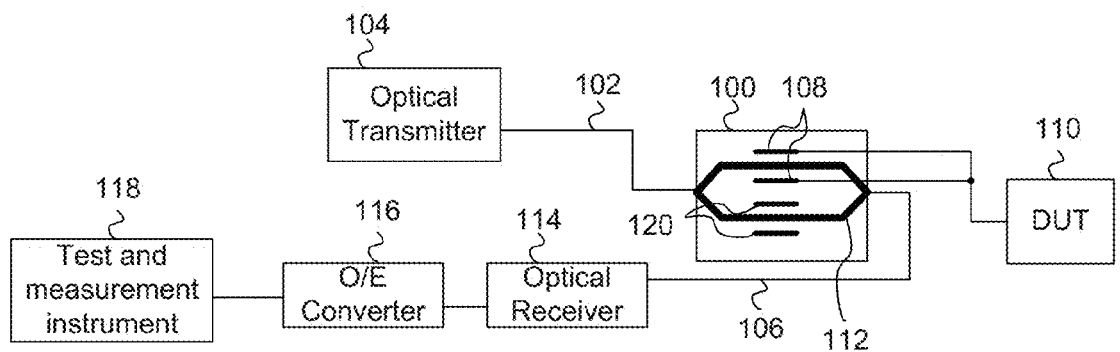
FIG. 1 illustrates an embodiment of a test and measurement system of the disclosed technology.

In the drawings, which are not necessarily to scale, like or corresponding elements of the disclosed systems and methods are denoted by the same reference numerals.

Electro-optical sensors, such as electro-optical sensor 100 shown in FIG. 1, generally have two optical connections, an input 102 of an unmodulated light beam from an optical transmitter 104 and an output 106 that has been modulated by an electrical signal applied to electrodes 108 and 120. The optical transmitter 104 sends an unmodulated light beam to the electro-optical sensor 100. At least two of the electrodes 108 are connected to a device under test (DUT) 110. The other two electrodes 120 are connected to a bias controller (not shown) to control a bias of the electro-optical sensor. As the unmodulated light passes through waveguide 112, the unmodulated light becomes modulated due to the applied electrical signal from electrodes 108 connected to the device under test 110.

The modulated light is sent to an optical receiver 114 and converted to an electrical signal in optical-to-electrical (O/E) converter 116. Then, the optical-to-electrical converter 116 sends the signal to a processor on a test and measurement instrument 118 for further processing or to be displayed on a display (not shown) of the test and measurement instrument 118 or to be stored in a memory (not shown) of the test and measurement instrument 118.

In the electro-optical sensor 100, an applied voltage from the electrodes 108 causes the light beam traveling in the waveguide 112 to change in relative phase as the light travels between two branches of the waveguide 112.

Figure 2:
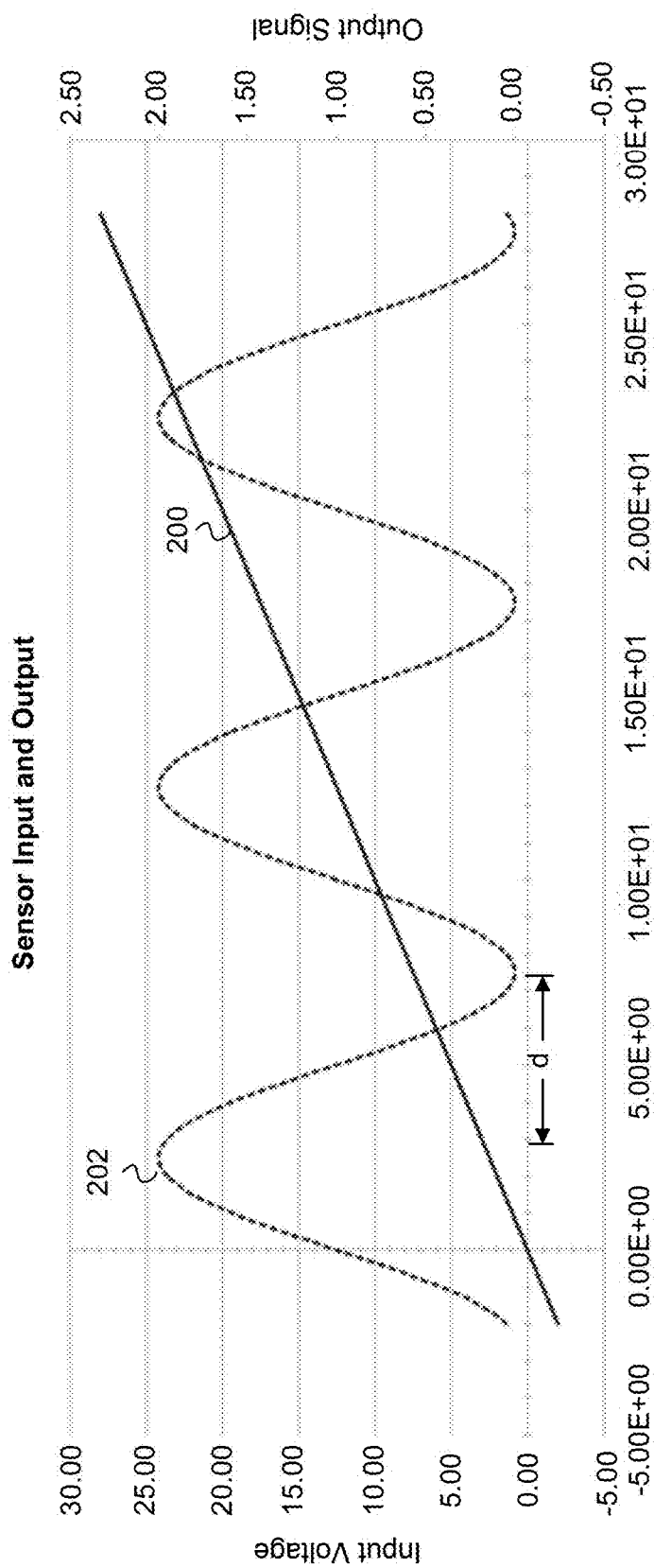
FIG. 2 illustrates a linear input waveform 200 and a modulated output 202 waveform of an optical sensor.

FIG. 2 shows a linear input 200 of the device under test that varies linearly from −15 volts to +15 volts. As the relative phase of the light beam within the two branches of the waveguide 112 changes, a modulated output waveform 202 from the electro-optical sensor varies sinusoidally as the input voltage varies linearly. The voltage difference between a peak and valley of the sinusoidal modulated output waveform 202 is called a pi-voltage and is shown by d in FIG. 2. In the plot shown in FIG. 2, the pi-voltage of the electro-optical sensor is 5 volts.

Figure 3:
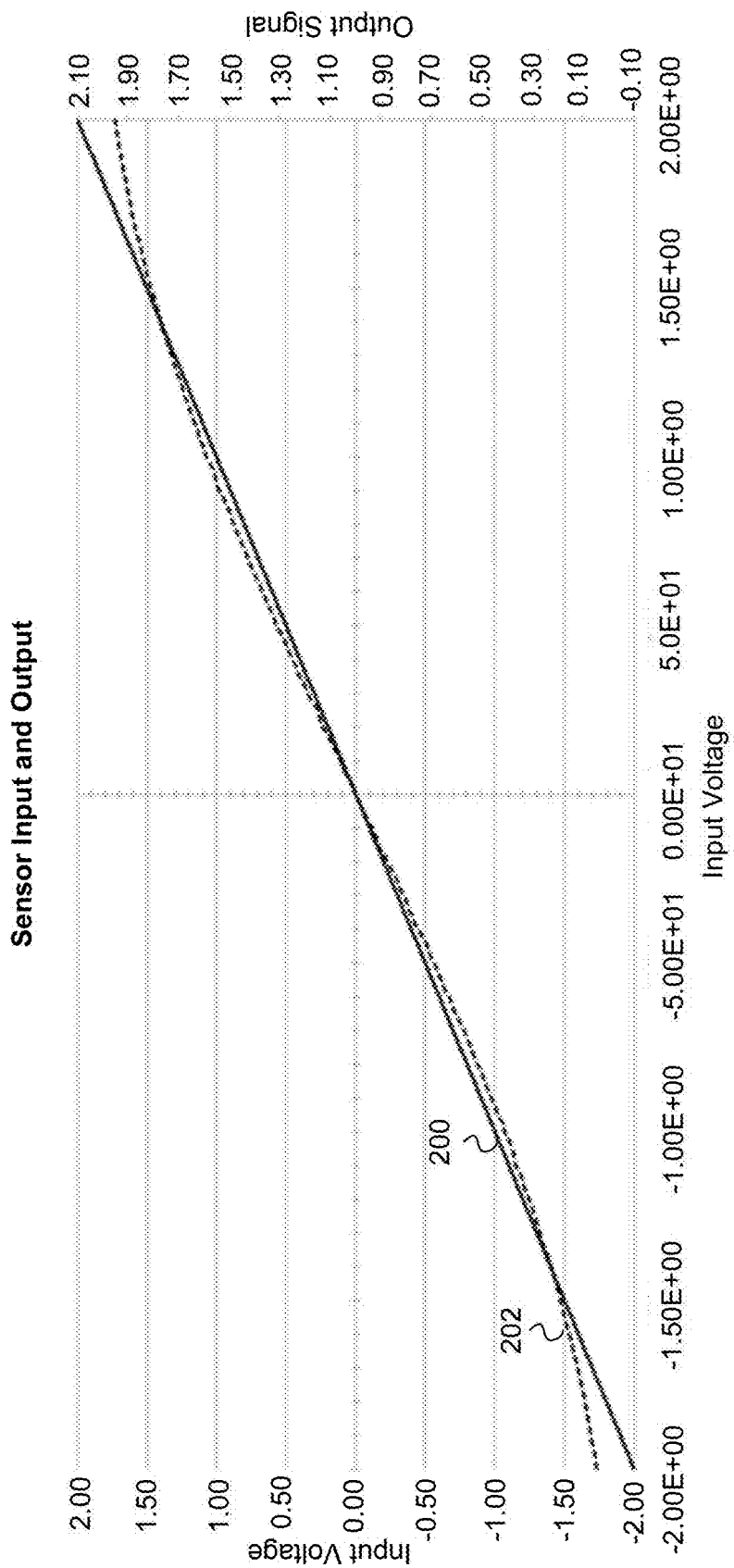
FIG. 3 illustrates a linear input waveform 200 and a modulated output waveform 202 of an optical sensor in an input range of +/−2 volts.

Traditionally, to use an electro-optical sensor as a voltage accessory with a linear response the input range to the electro-optical sensor was restricted to a small fraction of the pi-voltage of the electro-optical sensor. Then, the device under test is operated around a point in the modulated output where the response is fairly linear, as shown in FIG. 3. In FIG. 3, the input range is restricted to +/−2 volts. As can be seen in the plot, the response from the output is approximately linear over the +/−2 volt range. However, the modulated output waveform 202 increasingly deviates from linearity at the edges of the waveform within the restricted +/−2 volts.

Figure 4:
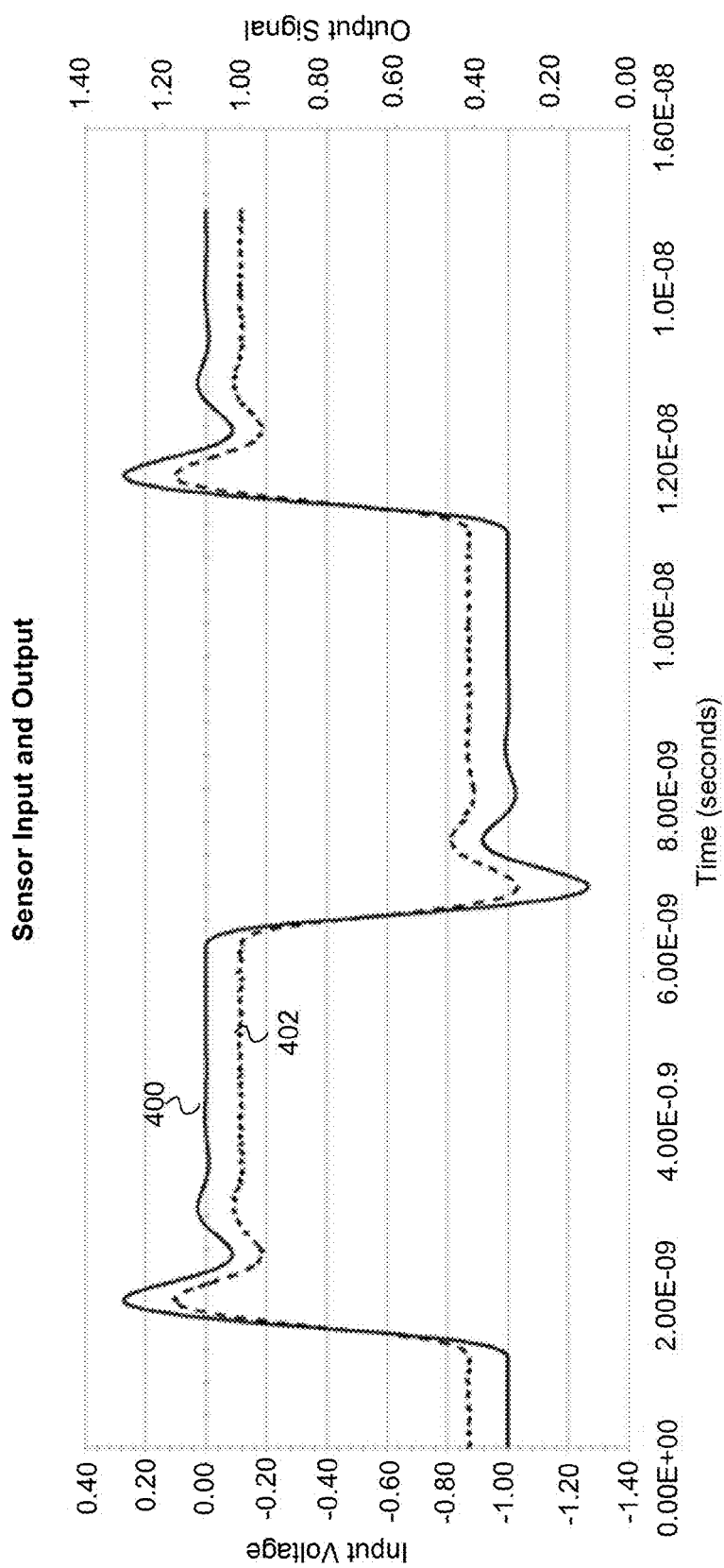
FIGS. 4-6 illustrate an input waveform of a device under test and various output waveforms from an optical sensor.
Figure 5:
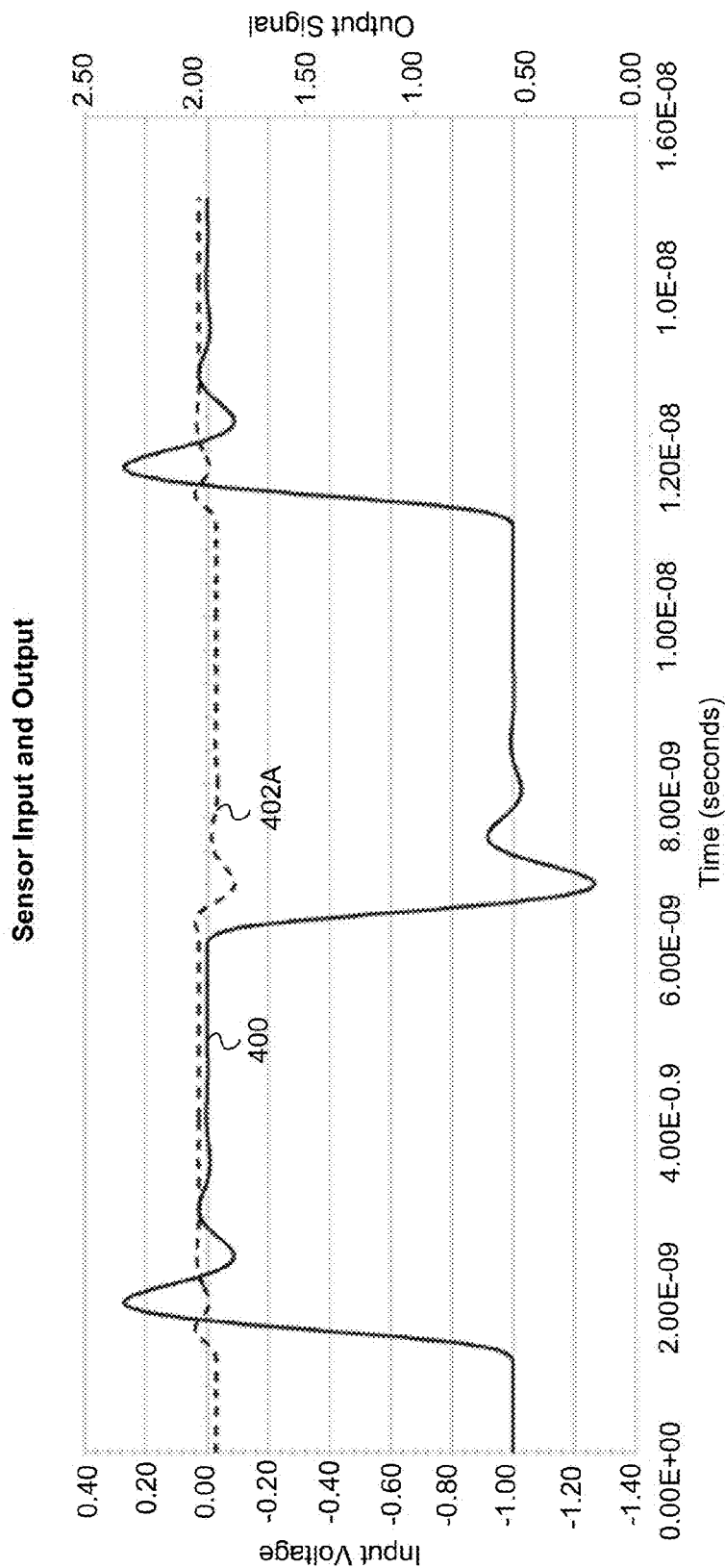
Figure 6:
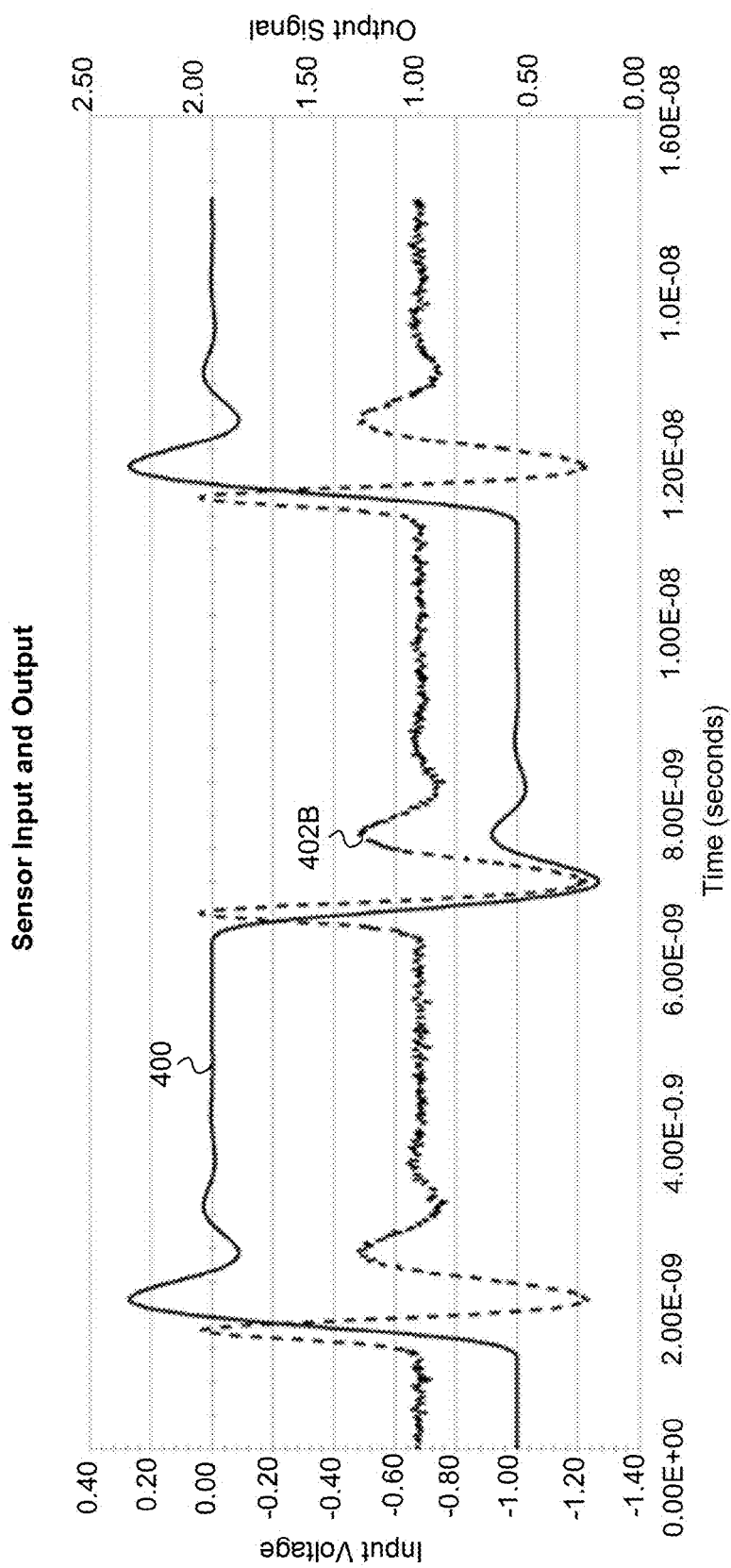

For example, as seen in FIG. 4, if an input waveform is approximately a step signal, then the input waveform 400 and output waveform 402 may look as shown in FIG. 4. As an input amplitude and bias point change, however, an output waveform 402A and 402B can become unrecognizable, as seen in FIGS. 5 and 6. In FIG. 4-6, the output waveform 402 does not accurately resemble the input waveform 400. Therefore, a user of the test and measurement instrument does not get an accurate representation of the voltage input waveform 400 via the output waveform 402.

Figure 8:
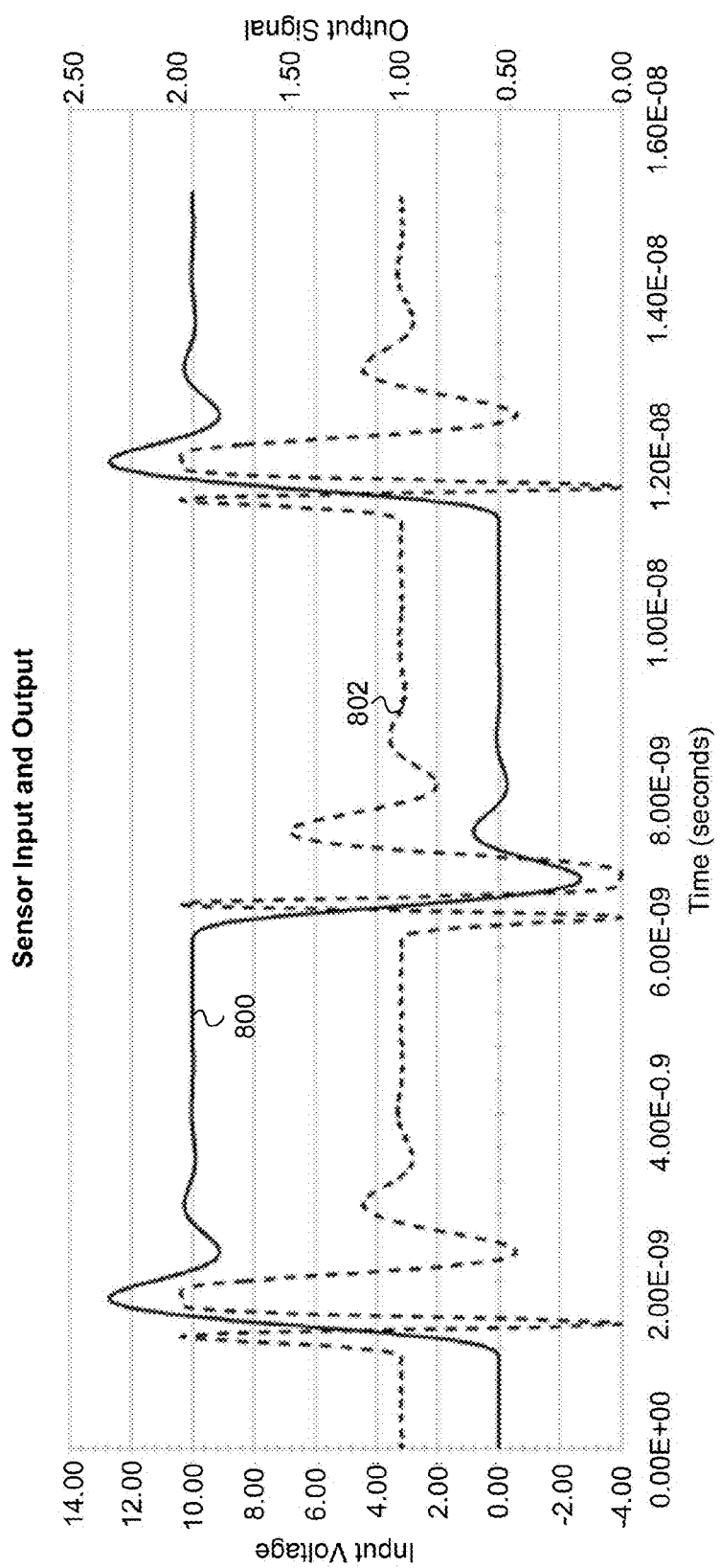
FIGS. 8-12 illustrate plots according to the method shown in FIG. 7.

The disclosed technology, however, can recover or reconstruct the input waveform 400 from the device under test so that an electro-optical sensor can accurately measure an input voltage from a device under test over voltages that exceed the linear input range of the electro-optical sensor, which is equal to the pi-voltage. For example, FIG. 8 shows a modulator pi-voltage of 5 volts and an input signal, also referred to herein as an input waveform, that goes from −2.7 volts to +12.7 volts. As can be seen in FIG. 8, the modulated output waveform 802 does not resemble the input waveform 800.

Figure 7:
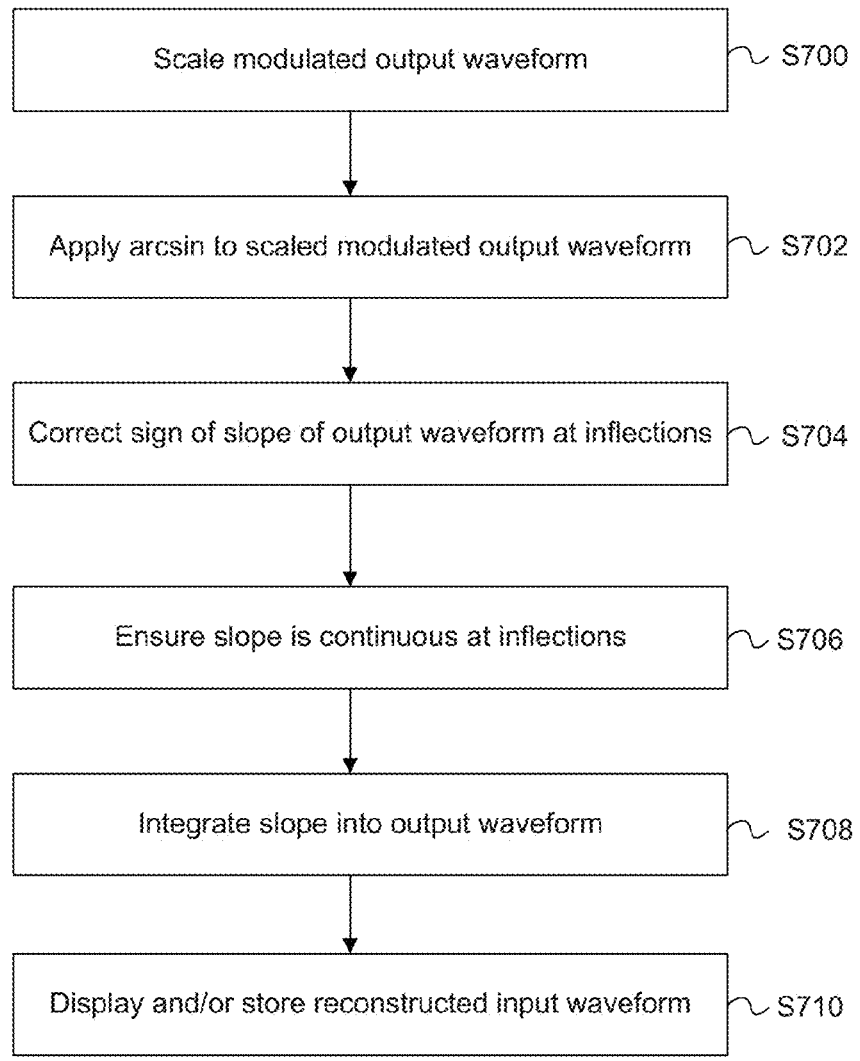
FIG. 7 illustrates a method of the disclosed technology for reconstructing an input waveform from a device under test.
Figure 9:
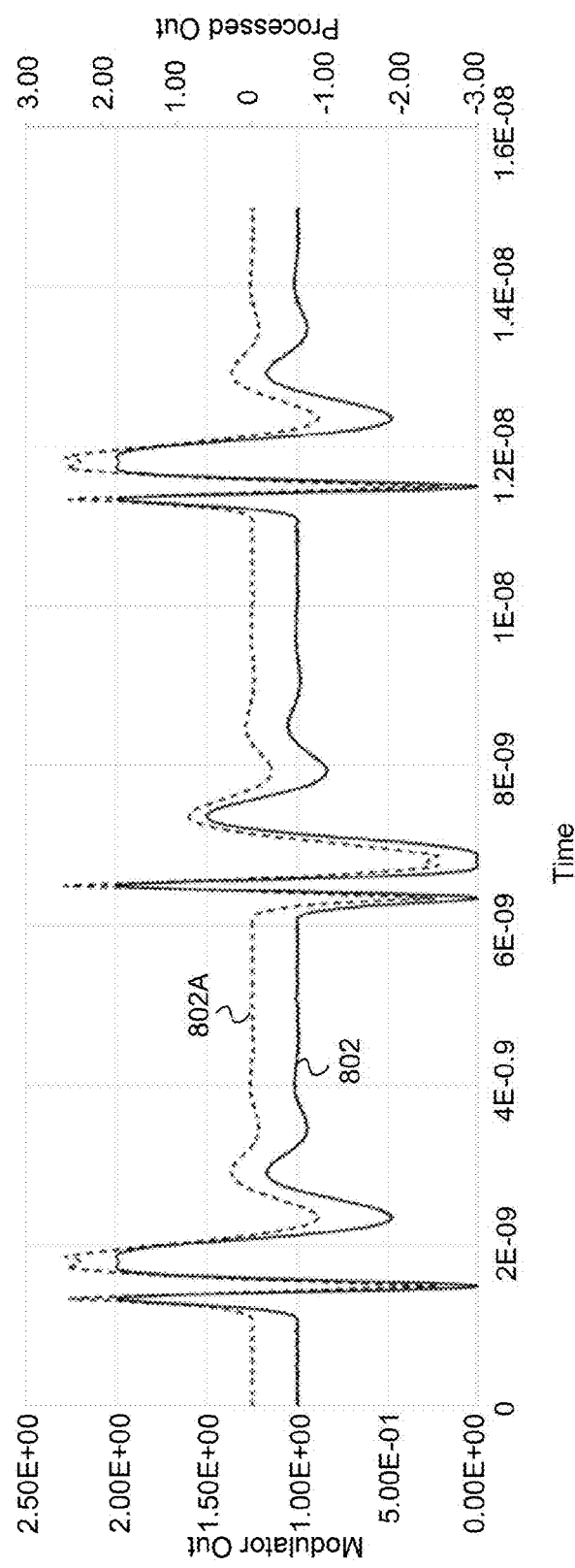

First, in step S700 in FIG. 7, the modulated output signal 802, also referred to herein as an output waveform, is scaled to match an input range of an arc sin of the modulated output waveform 802, as shown in FIG. 9. Output waveform 802A represents the scaled modulated output waveform. In this example, the input range of the arcsin is +/−1 volt. Then, in step S702, the arcsin, or inverse function, is applied to the modulated output waveform 802B to linearize the modulated output waveform, with the resulting linearized modulated output waveform 802C, as shown in FIG. 10.

Figure 10:
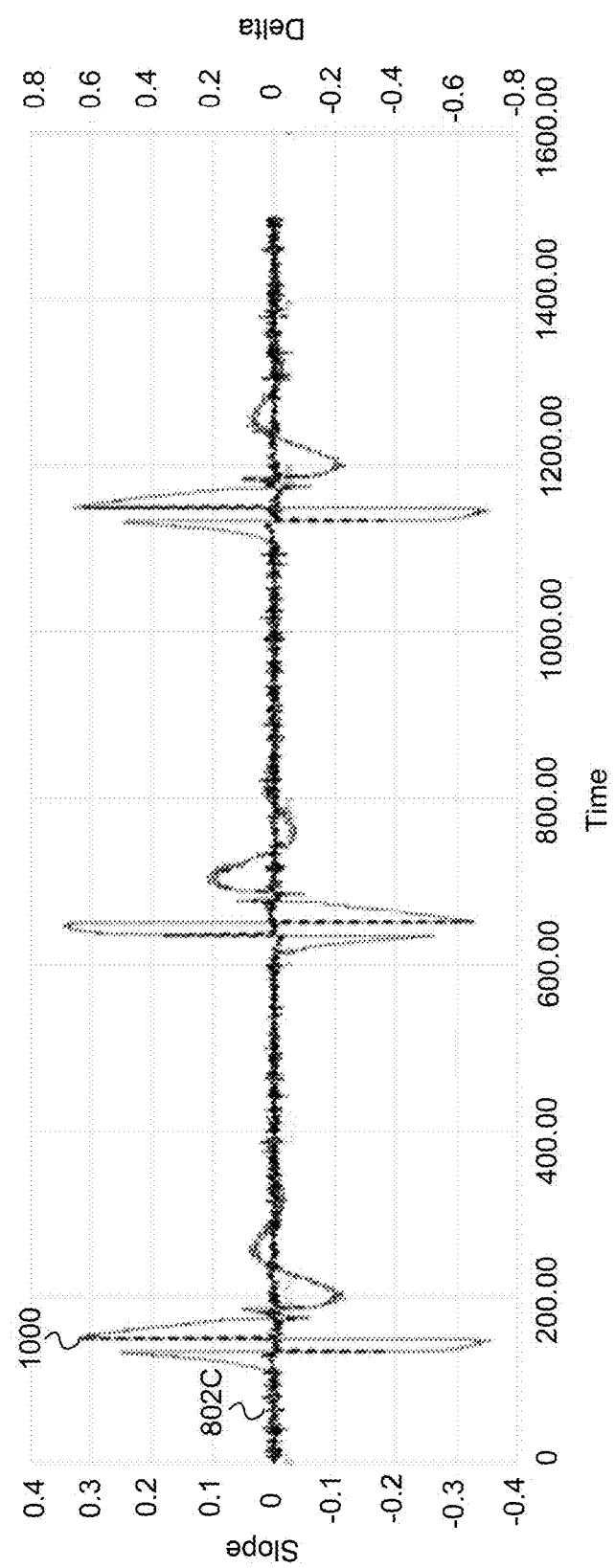
Figure 11:
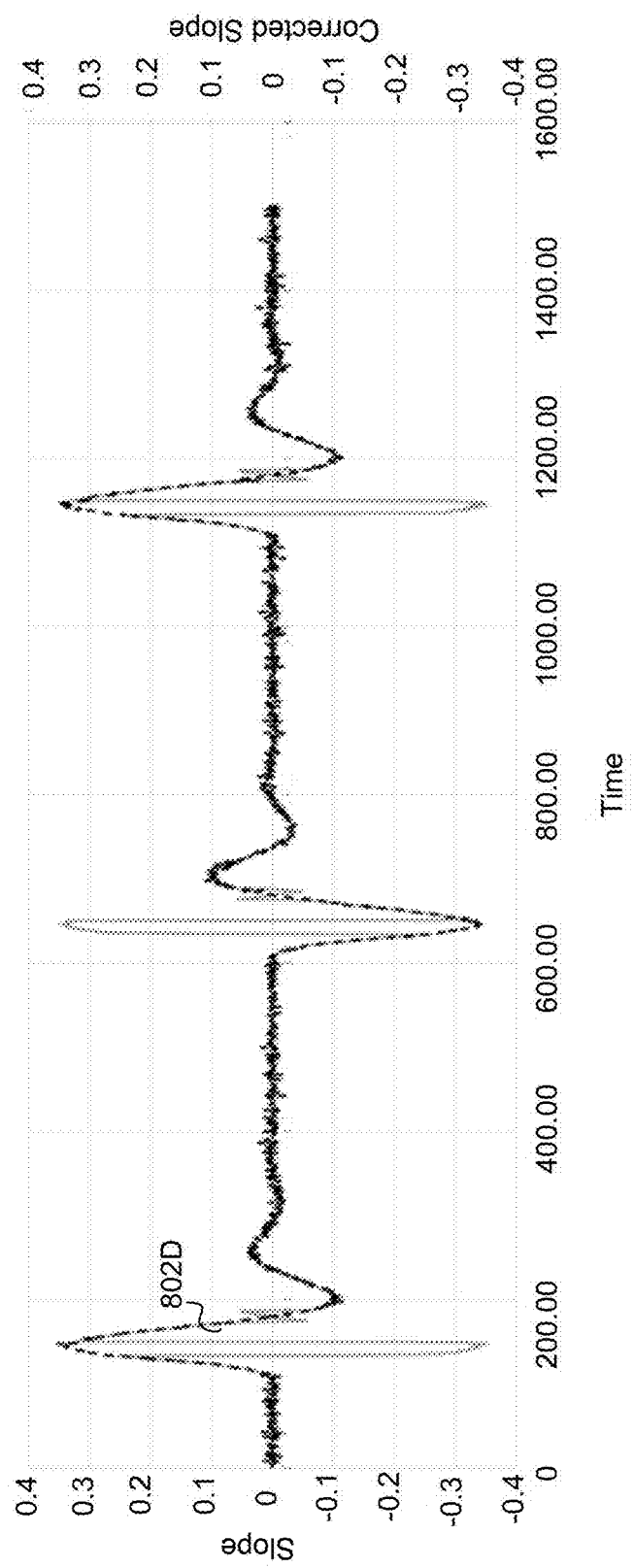

Although applying the arcsin linearizes the modulated output waveform 402, the waveform has abrupt inflection points 1000, as shown in FIG. 10, where the pi-voltage of the electro-optical sensor has been exceeded. The abrupt inflection points 1000 show up as discontinuities in the slope of the output from steps S700 and S702, as can be seen in FIG. 10. Every time one of these inflections 1000 occurs, the inflections indicate that the linear input has exceeded the pi-voltage of the electro-optical sensor, causing the slope of the output to change signs.

Figure 12:
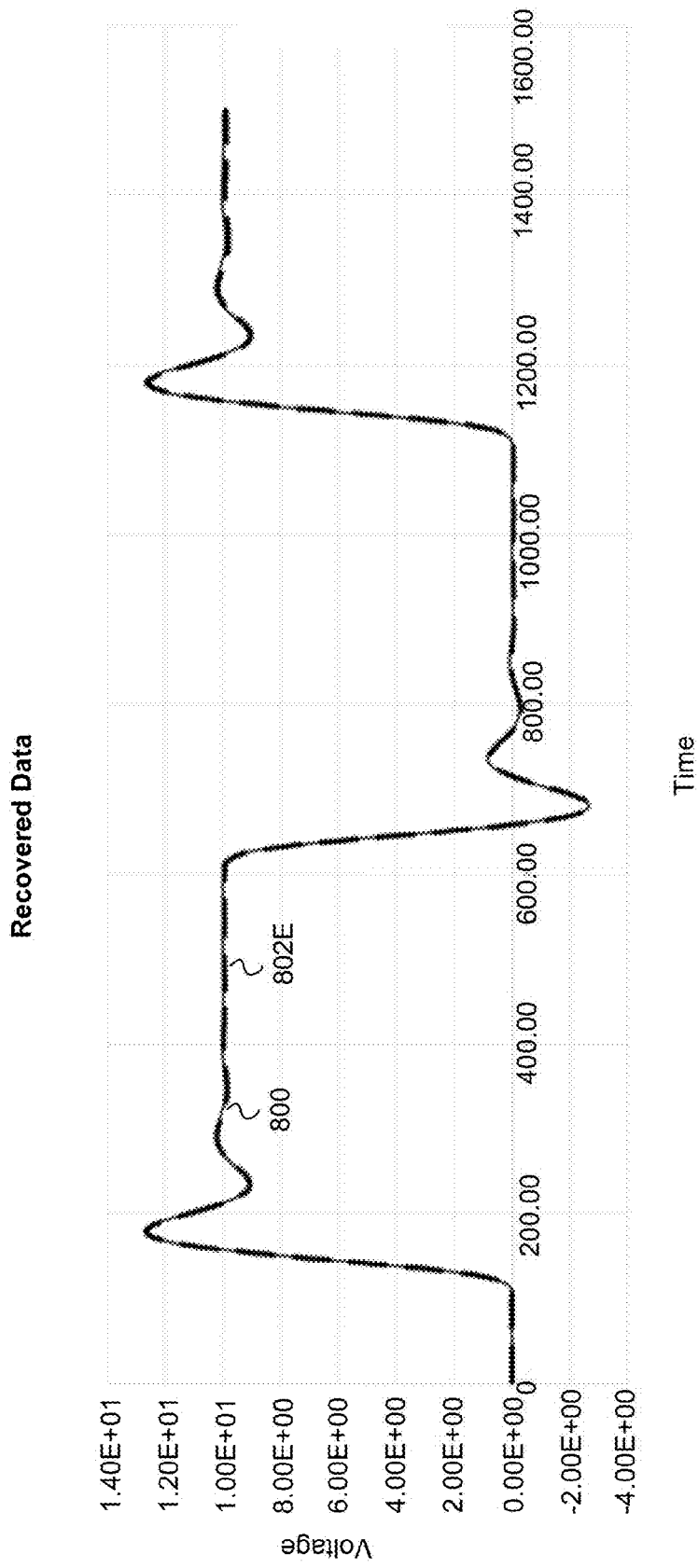

In step S704, however, the modulated output waveform 402 can be corrected by correcting the sign of the slope at the output waveform resulting in the output waveform 802D. In step S706, it is ensured that the slope is continuous. Then, in step S708, the slope 802E is integrated into the result, as shown in FIG. 12. Then, at step S710, the reconstructed or recovered input waveform is displayed on the display of a test and measurement instrument or stored in memory of the test and measurement instrument. Accordingly, after processing the original modulated output waveform 402 shown in FIG. 4, the reconstructed or recovered modulated output waveform 402 is identical to the input waveform 400, as seen in FIG. 12.

Figure 13:
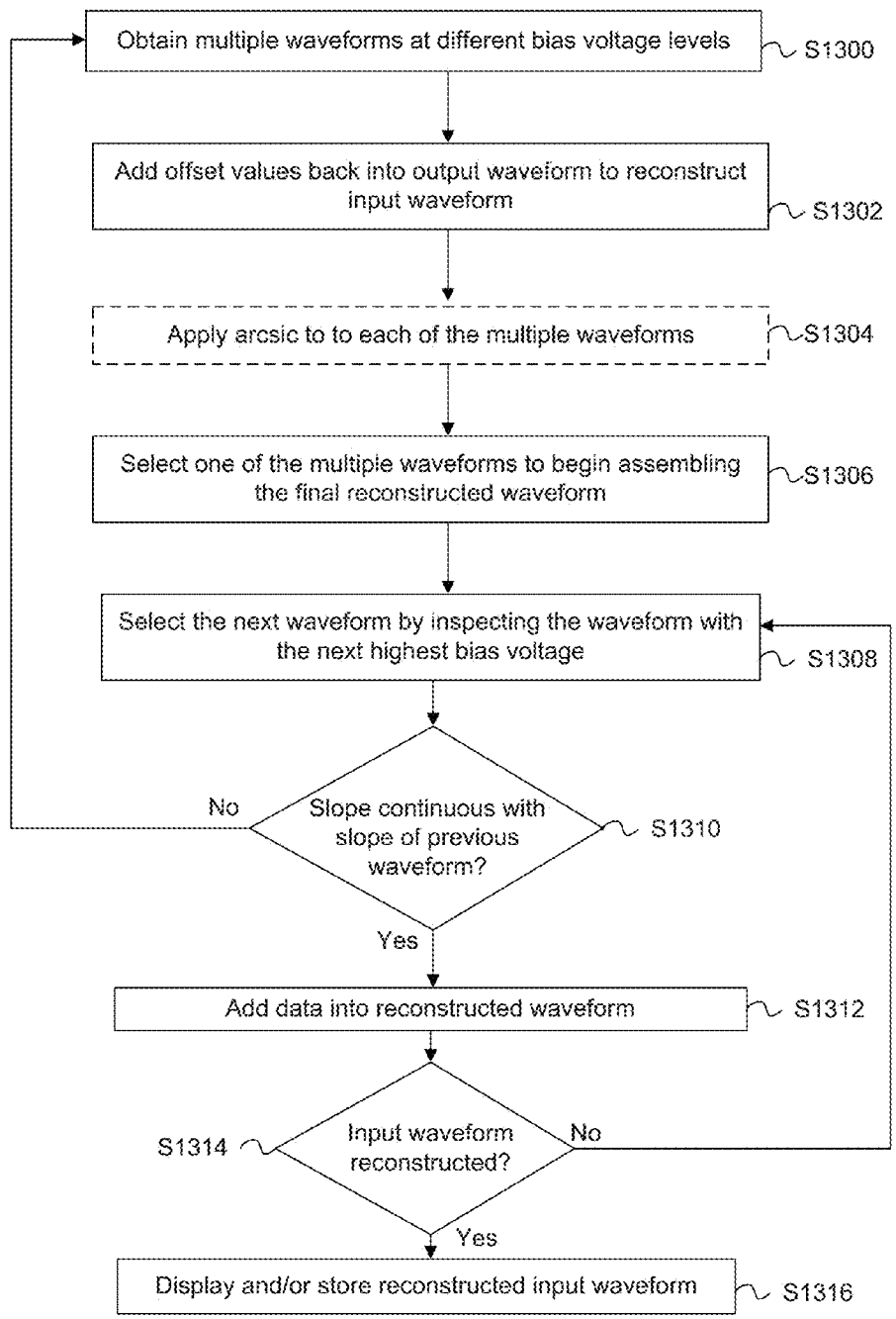
FIG. 13 illustrates a method of the disclosed technology for reconstructing an input waveform from a device under test.
Figure 14:
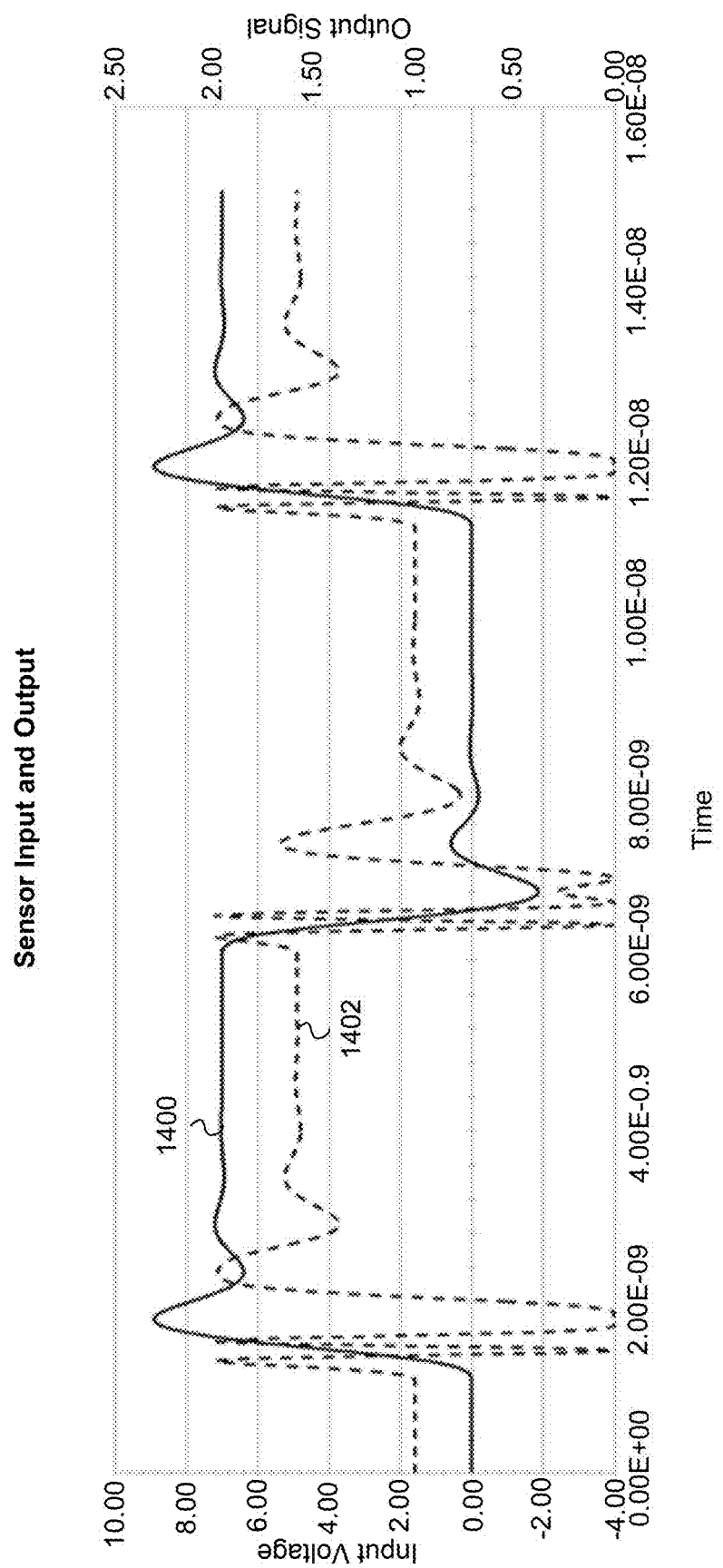
FIGS. 14-16 illustrate plots according to the method shown in FIG. 16.
Figure 15:
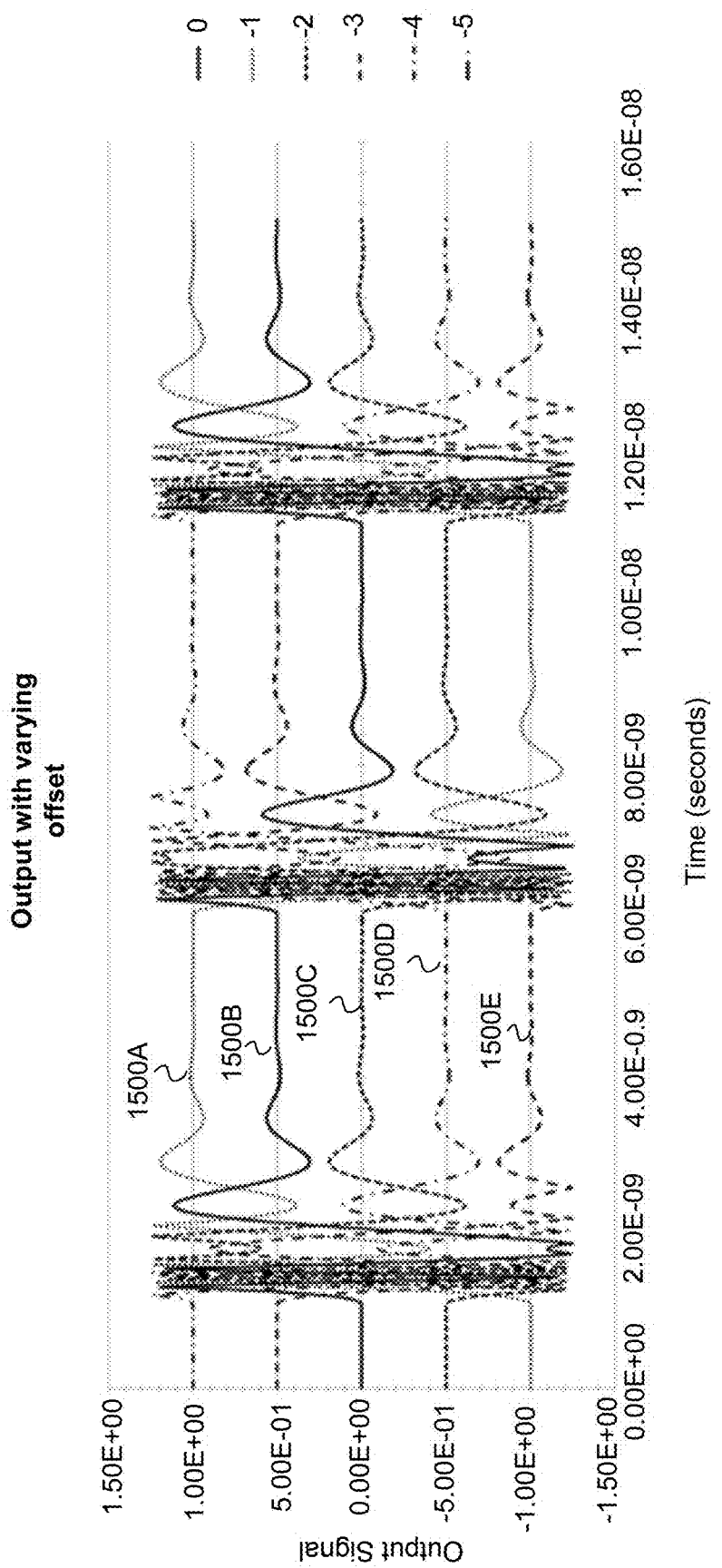

Input waveforms can also be recovered or reconstructed if the input waveform is a repetitive waveform. FIG. 13 illustrates the method of the disclosed technology for recovering or reconstructing the repetitive input waveform. In this example, the input 1400 and original output waveform 1402 can be seen in FIG. 14. In step S1300, multiple waveforms 1500A-E are obtained with different bias voltage levels, as shown in FIG. 15. The different bias voltage levels are obtained by changing the applied electrical signal from a bias controller (not shown) that is attached to the bias electrodes 120, shown in FIG. 1.

In method shown in FIG. 13, the bias voltage is added back in to each of the multiple output waveforms in step S1302. An optional second step S1304 is to once again apply the arcsin function to each of the multiple output waveforms. If the arcsin function is not applied, the final output waveform will be approximately linear over a limited range. By applying the arcsin function, this range can be extended, reducing the number of steps required to recover the reconstructed waveform.

Figure 16:
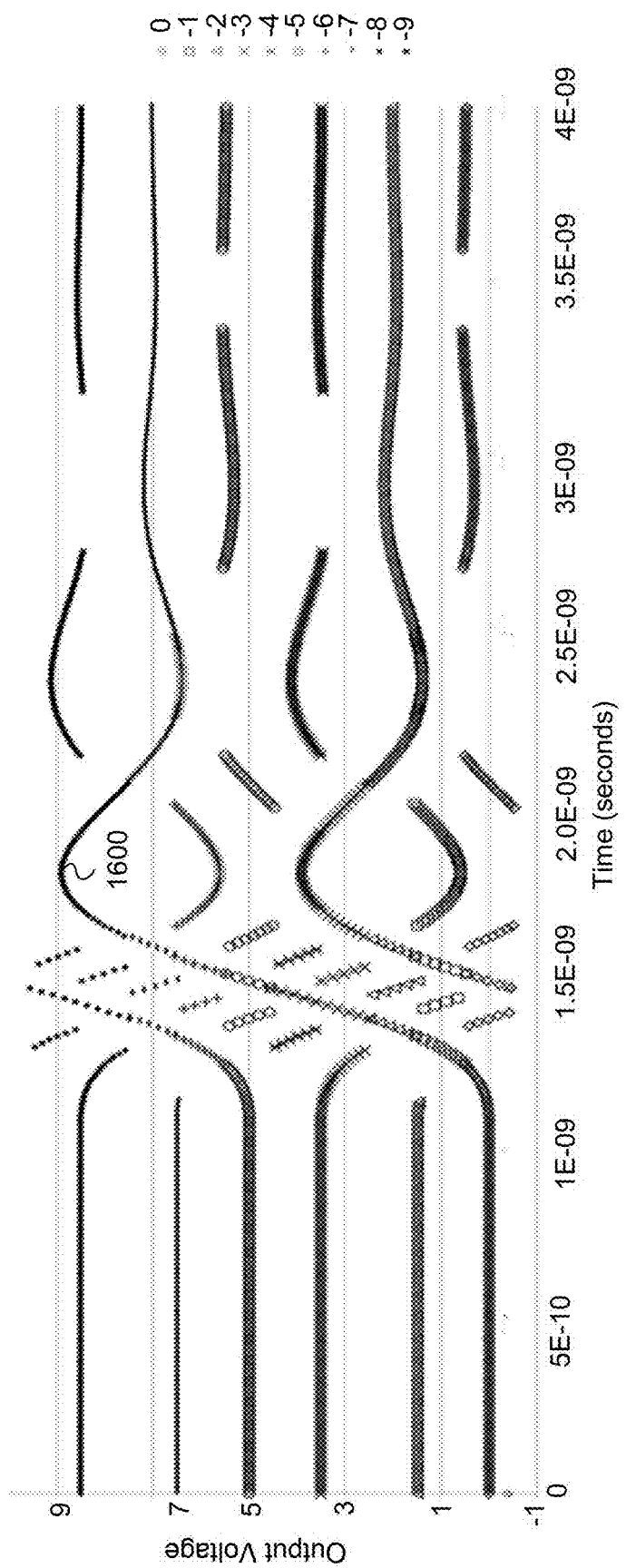

The next step S1306 is to select one of the resulting waveforms to begin assembling the final reconstructed waveform. This waveform can be selected by inspecting the beginning of the transition region and ensuring that the slope of the transition is in the expected direction. The data from this waveform is used for the reconstructed waveform, until the data from the first waveform approaches the limit of the linear range. The next waveform is selected in step S1308 by inspecting the waveform with the next highest bias voltage. In step S1310, the method ensures that the values and slope of the data from the second waveform are continuous with the values and slope of the first waveform. If this condition is met, then the data from the second waveform is added to the reconstructed waveform in step S1312, until the linear range of the second waveform is reached. If this condition is not met, then it indicates that the offset steps used when the waveforms were obtained were too large, or the transition is not of the expected polarity and the process begins again at S1300 by obtaining multiple waveforms at different bias voltage levels with smaller offset steps. After the data is from the second waveform is added to the reconstructed waveform in step S1312, the method determines if the input waveform has been reconstructed in step S1314. If so, then the reconstructed input waveform is displayed or stored in a test and measurement instrument in step S1316. If not, then the process repeats steps S1308-S1314. Another approach to reconstruct the input waveform is to adjust the input bias so the output waveform is centered on a display of a test and measurement instrument in step S1700. A sweep can then be started in step S1702. During the sweep, the test and measurement instrument may sequentially adjust an offset of each point of the output waveform to be centered on the display to reconstruct the input waveform of the electro-optical voltage accessory that exceeds the linear input range of the optical sensor in step S1704. The resulting waveform can then be reconstructed from the time versus adjusted bias voltage for each data point in sequence in step S1706. This process can be followed over many times the pi-voltage. Since the output of the sensor is a sinusoidal function of the bias voltage, if the required bias voltage exceeds the range of the circuit applying the bias voltage, the bias voltage can be set to the required voltage minus the pi-voltage. As long as this resetting of the bias voltage is tracked every time it occurs, then this process can be repeated over multiple pi-voltages. The resulting waveform looks like that shown in FIG. 16.

Figure 17:
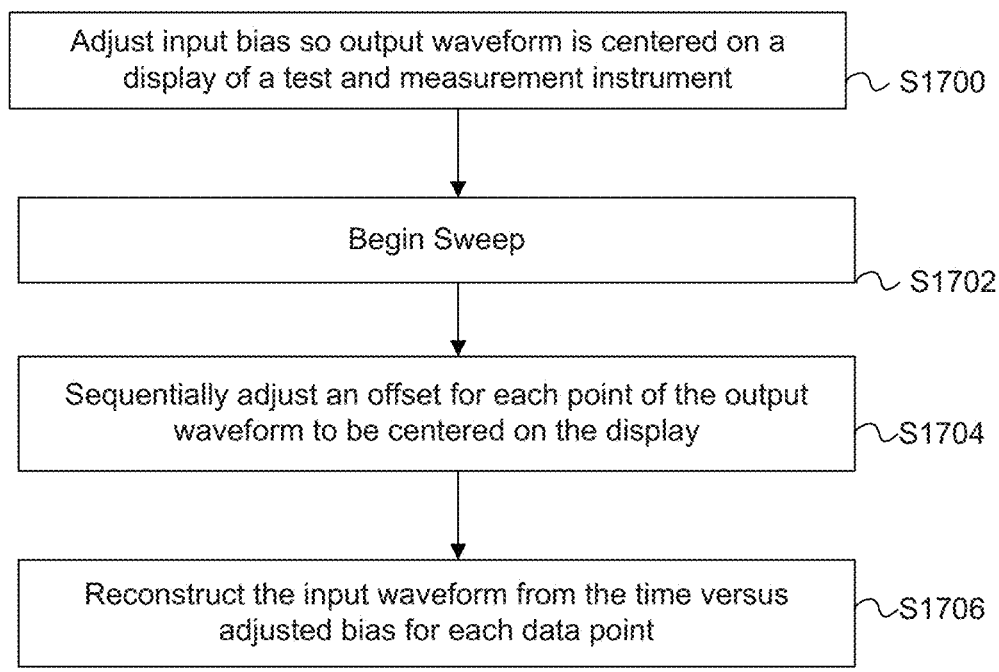
FIG. 17 illustrates a method of the disclosed technology for reconstructing an input waveform from a device under test.

The methods of FIGS. 7, 13 and 17 can be performed either on the test and measurement system or on a device external to the test and measurement instrument by a processor. If the device is external to the test and measurement instrument, then the output waveform received by the test and measurement instrument is transferred to the external device. The external device then performs the process of FIG. 7 or FIG. 13 to reconstruct the input waveform of the device under test. When the input waveform has been reconstructed, the input waveform is then transferred back to the test and measurement instrument to be stored in memory or displayed on a display of the test and measurement instrument.

The test and measurement instrument may be an oscilloscope, logic analyzer, spectrum analyzer or similar such devices having an accessory device interface for accepting an accessory device.

The term "controller" and "processor" as used herein is intended to include microprocessors, microcomputers, ASICs, and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

What is claimed is:

1. A test and measurement system, comprising:
   an electro-optical voltage accessory with an optical sensor configured to output a modulated output signal;
   a device under test connected to the electro-optical voltage accessory with a variable input signal that exceeds the linear input range of the optical sensor; and
   a processor configured to modify the modulated output signal from the electro-optical voltage accessory to reconstruct the variable input signal of the electro-optical voltage accessory that exceeds the linear input range of the optical sensor.

2. The test and measurement system of claim 1, the processor further configured to:
   scale the modulated output signal to match an input range of an arcsin;
   apply the arcsin function to the scaled modulated output signal to linearize the scaled modulated output signal for producing a linearized scaled modulated output signal which indicates a plurality of transition points in the modulated output signal;
   correct a sign of a slope of the linearized scaled modulated output signal at each of the plurality of transition points to create a corrected slope; and
   integrate the corrected slope with the modulated output signal to reconstruct the variable input signal of the electro-optical voltage accessory.

3. The test and measurement system of claim 1, wherein the electro-optical voltage accessory is further configured to output multiple modulated output signals at different bias voltage levels; and
   wherein the processor is further configured to reconstruct the variable input signal of the electro-optical voltage accessory by offsetting the different bias voltage levels of the modulated output signals.

4. The test and measurement system of claim 1, further comprising a test and measurement instrument with a display to display the modified modulated output signal.

5. The test and measurement system of claim 4, the processor further configured to adjust the modified modulated output signal on the display to center the modulated output signal to be centered on the display and sequentially adjusting a bias voltage level of the optical sensor at of each point of the modulated output signal to be centered on the screen to reconstruct the variable input signal of the electro-optical voltage accessory that exceeds the linear range of the optical sensor.

6. The test and measurement system of claim 1, wherein the optical sensor is a Mach-Zehnder optical sensor.

7. The test and measurement system of claim 1, wherein the processor is located on a test and measurement instrument or an external device.

8. A method for measuring a variable input signal of a device under test via an electro-optical voltage accessory connected to a test and measurement instrument that exceeds a linear input range of an optical sensor in the electro-optical voltage accessory, the method comprising:
   receiving at the electro-optical voltage accessory the variable input signal of the device under test;
   outputting from the electro-optical voltage accessory a modulated output signal based on the variable input signal;
   receiving the modulated output signal from the electro-optical voltage accessory at a processor; and
   modifying the modulated output signal from the electro-optical voltage accessory to reconstruct the variable input signal of the electro-optical voltage accessory that exceeds the linear input range of the optical sensor.

9. The method of claim 8, the method further comprising: scaling the modulated output signal to match an input range of an arc sin; applying the arc sin function to the scaled modulated output signal to linearize the scaled modulated output signal which indicates a plurality of transition points in the modulated output signal; correcting a sign of a slope of the linearized scaled modulated output signal at each of the plurality of transition points to create a corrected slope; and integrating the corrected slope with the linearized scaled modulated output signal to reconstruct the variable input signal of the electro-optical voltage accessory.

10. The method of claim 8, the method further comprising: outputting multiple modulated output signals at different bias voltage levels; and reconstructing the variable input signal of the electro-optical voltage accessory by adding the different offset input levels together.

11. The method of claim 10, the method further comprising applying an arcsin function to each of the multiple waveforms.

12. The method of claim 10, the method further comprising:
   selecting one of the multiple waveforms by inspecting the beginning of the transition region and ensuring that the slope of the transition is in an expected direction;
   using the data from the selected waveform until the selected waveform approaches a limit of a linear range;
   selecting another one of the multiple waveforms with the next highest bia voltage and ensuring that a slope from the selected other waveform is continuation with the slope of the selected waveform; and
   adding the data from the selected other waveform to the selected first waveform to reconstruct the input waveform.

13. The method of claim 8, the method further comprising: adjusting the output on the display to center the modulated output signal to be centered on a display of a test and measurement instrument; and sequentially adjusting an offset of each point of the modulated output signal to be centered on the display to reconstruct the variable input signal of the electro-optical voltage accessory that exceeds the linear input range of the optical sensor.

14. The method of claim 8, wherein the optical sensor is a Mach-Zehnder optical sensor.

* * * * *